United States Patent [19]

Adams

[11] Patent Number: 5,323,024

[45] Date of Patent: Jun. 21, 1994

[54] RELATIVISTIC SEMICONDUCTOR PLASMA WAVE FREQUENCY UP-CONVERTER

[76] Inventor: Jeff C. Adams, 14311 166th Place SE., Renton, Wash. 98059

[21] Appl. No.: 959,134

[22] Filed: Oct. 9, 1992

[51] Int. Cl.$^5$ .......................................... H01L 27/14
[52] U.S. Cl. ...................................... 257/80; 257/82; 257/98; 257/432; 359/248; 385/18; 332/135
[58] Field of Search ...................... 257/82, 98, 81, 80, 257/14, 432; 359/247, 248; 385/14, 18; 332/130, 135; 333/204, 208, 238, 239, 240, 247; 342/6; 250/211 R, 211 J

[56] References Cited

U.S. PATENT DOCUMENTS

| | | | |
|---|---|---|---|
| 4,612,641 | 9/1986 | Corkum | 372/70 X |
| 4,864,119 | 9/1989 | Ragle et al. | 250/211 R |
| 5,028,971 | 7/1991 | Kim et al. | 357/30 |

OTHER PUBLICATIONS

Savage et al., "Generation of Highly Tunable Microwave Radiation via a Relativistic Ionization Front," IEEE MTT-S Digest, 1991, pp. 1315-1318.

Savage et al., "Frequency Up Conversion of Electro Magnetic Radiation Upon Transmission into an Ionization Front," Physical Review Letters, vol. 68, No. 7, Feb. 17, 1992, pp. 946-948.

Savage et al., "Tunable Radiation Generation Using Underdense Ionization Fronts," Institute of Plasma and Fusion Research, University of California at Los Angeles, Proceedings of International Conference on Research Trends in Coherent Radiation Generation and Particle Accelerators, Feb. 11-12, 1991, pp. 1-16.

Lee et al., "Optical Control of Millimeter-Wave Propagation in Dielectric Waveguides," IEEE Journal of Quantum Electronics, vol. QE-16, No. 3, Mar. 1980, pp. 277-288.

Motet, et al., "1.4 ps rise-time high-voltage photoconductive switching," Appl. Phys. Lett. 59 (12) Sep. 16, 1991, pp. 1455-1457.

Buzzi, et al., Experimental Evidence of Relativistic Doppler Frequency Conversion on a Relativistic Electron Beam Front, IEEE Transactions on Microwave Theory And Techniques, vol. MTT-25, No. 6, Jun. 1977, pp. 559-560.

Lee, et al., Optical Control of Millimeter $\propto$ Wave Propagation in Dielectric Waveguides, IEEE Journal of Quantum Electronics, vol. QE-16, No. 3, Mar. 1980, pp. 277-288.

Vaucher, et al., Theory of Optically Controlled Millimeter-Wave Phase Shifters, IEEE Transactions on Microwave Theory and Techniques, vol. MRR-31, No. 2, Feb. 1983, pp. 209-216.

Seeds, et al., Optical Control of Microwave Semiconductor Devices, IEEE Transactions on Microwave Theory and Techniques, vol. 38, No. 5, May 1990, pp. 577-585.

Huff and Anthes, Optoelectronic Isolator for Microwave Applications, IEEE Transactions on Microwave Theory and Techniques, vol. 38, No. 5, May 1990, pp. 571-576.

Arjavalingam, et al., Broad-Band Microwave Measurements with Transient Radiation from Optoelectronically Pulsed Antennas, IEEE Transactions on Microwave Theory and Techniques, vol. 38, No. 5, May 1990, pp. 615-618.

Platte, Periodic-Structure Photoexcitation of a Silicon Coplanar Waveguide for Selective Optoelectronic Microwave Control, IEEE Transactions on Microwave Theory and Techniques, vol. 38, No. 5, May 1990, pp. 638-646.

Cheung, et al. Optically Controlled Coplanar Waveguide Phase Shifters, IEEE Transactions on Microwave Theory and Techniques, vol. 38, No. 5, May 1990, pp. 586-595.

(List continued on next page.)

Primary Examiner—William Mintel
Attorney, Agent, or Firm—Graybeal Jackson

[57] ABSTRACT

A device that frequency up-shifts an impinging electromagnetic wave, facilitating signal pulse compression, consisting of a semiconductor block or waveguide with an optically-induced relativistic plasma wave which interacts with an applied or self generated electromagnetic signal.

23 Claims, 6 Drawing Sheets

OTHER PUBLICATIONS

Lee, *Picosecond Optics and Microwave Technology*, IEEE Transactions on Microwave Theory and Techniques, vol. 38, No. 5, May 1990, pp. 596–607.

Stoudt, et al., *The Recovery Behavior of Semi-Insulating GaAs in Electron-Beam-Controlled Switches*, IEEE Transactions on Electron Devices, vol. 37, No. 12, Dec. 1990, pp. 2478–2485.

Savage, et al., *Generation of Highly Tunable Microwave Radiation Via A Relativistic Ionization Front*, 1991 IEEE MTT-S Digest, pp. 1315–1318.

Savage, et al., *Frequency Upconversion of Electromagnetic Radiation Upon Transmission Into An Ionization Front*, The American Physical Society, vol. 68, No. 7, Feb. 17, 1992, pp. 946–949.

Savage, et al., *Tunable Radiation Generation Using Underdense Ionization Fronts*, Institute of Plasma and Fusion Research, University of California at Los Angeles, Proceedings of International Conference on Research Trends in Coherent Radiation Generation and Particle Accelerators, Feb. 11–12, 1991, pp. 1–16.

Chiang, et al., *The Analysis of a Phase-Delayed Optical Two-State Switch*, IEEE Photonics Technology Letters, vol. 4, No. 4, Apr. 1992, pp. 368–370.

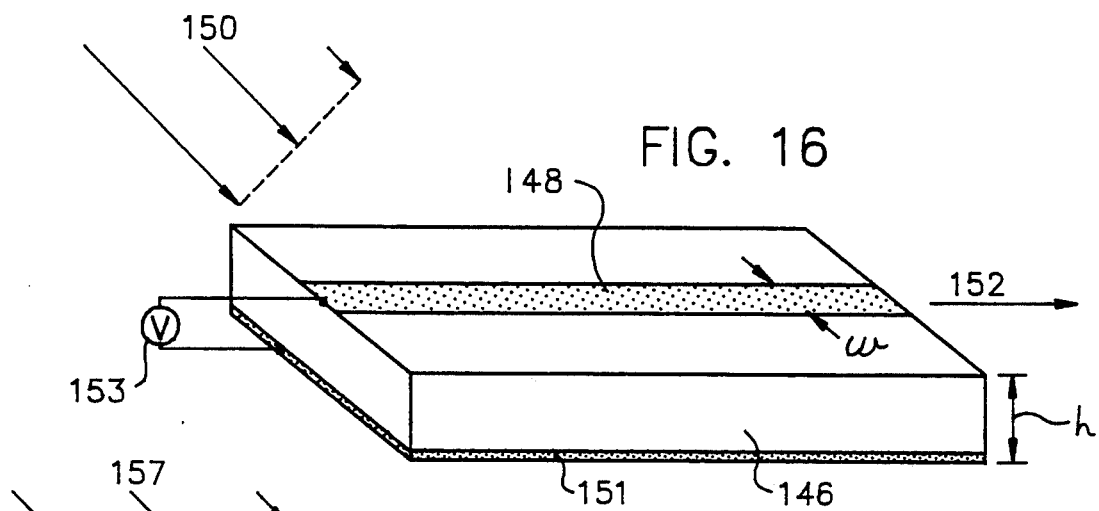
FIG. 16
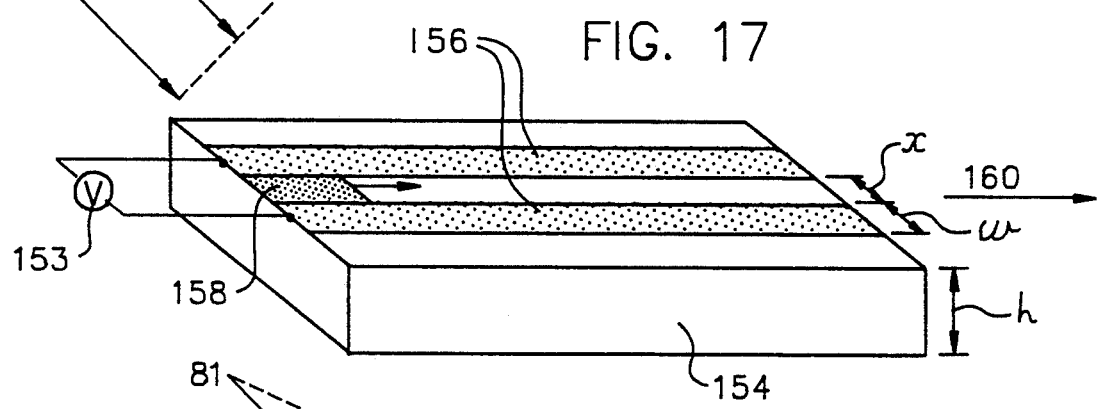
FIG. 17
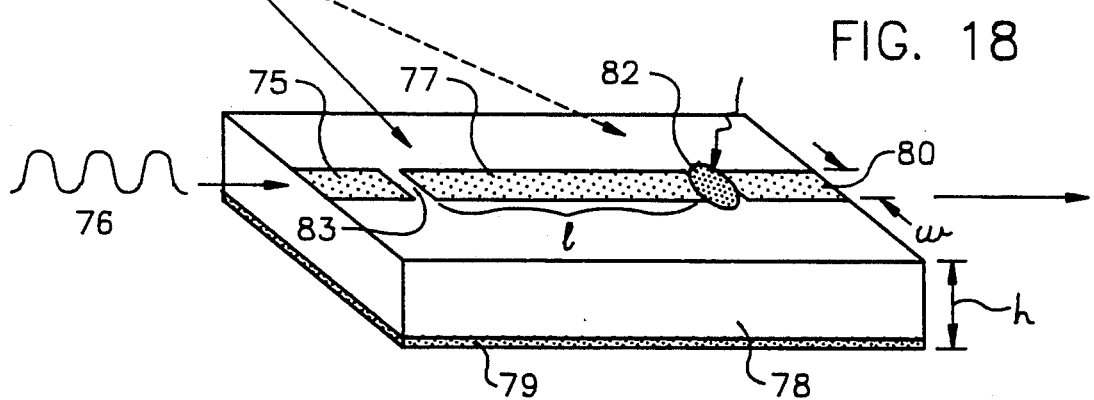
FIG. 18
FIG. 19
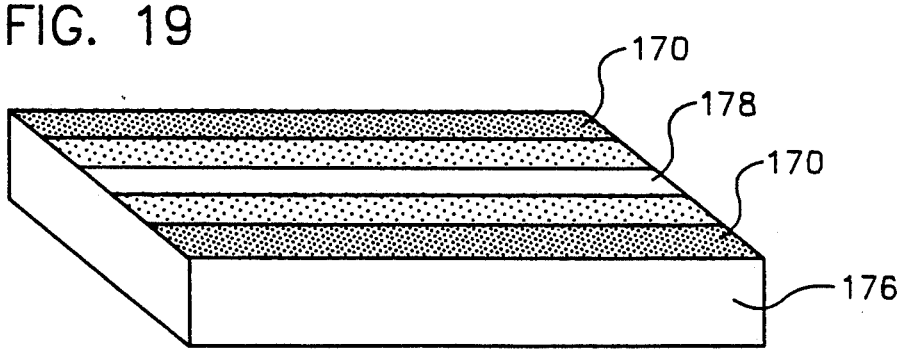

RELATIVISTIC SEMICONDUCTOR PLASMA WAVE FREQUENCY UP-CONVERTER

BACKGROUND

The present invention relates to the modification of an electromagnetic signal through interaction with an energy beam-induced moving plasma in a semiconductor. The modified signal is frequency up-shifted, producing a fast electromagnetic or electrical signal. The invented device can also generate fast electrical signals.

A prior art method of producing fast electromagnetic signals utilizes a photoconductive switch. A semiconductor is placed between two contacts which are connected to a voltage source in the external circuit. The semiconductor behaves like an insulator until it is made to conduct with laser illumination of the proper wavelength. A fast pulse of laser energy will thus produce a fast electrical signal in the external circuit. One basic version of this switch gives an electrical signal amplitude that is approximately proportional to the optical energy deposited in the semiconductor. The other basic version uses semiconductors such as GaAs which can turn on completely when the illumination energy is above some threshold. The basic mechanism for this later version is referred to as optically initiated avalanche. Discussions of these types of switches can be found in the following U.S. Pat. Nos.: Davis 4,438,331; Ragle 4,864,119; and Kim 5,028,971. The general advantage of photoconductive switches is their ability to produce fast, high amplitude pulses, for example, a 5 kV electrical pulse with a rise time of 100 picoseconds (ps).

More generally, a laser illumination of the proper wavelength and energy between two separated conductors on a semiconductor substrate will electrically connect or "short" the two conductors. Thus, by turning on such illumination, it is possible to make an electrical connection for as long as the optical energy is applied. For a review of this technology see Lee, "Picosecond optics and microwave technology," IEEE Trans. Microwave Theory Tech., vol. MTT-38, pp. 596–607, 1990.

A related technology uses adjustable location, stationary laser illumination on portions of a semiconductor waveguide in order to control the propagation velocity of the microwave signal. In this way, the application of laser light to the waveguide can be made to slow down the propagation of a microwave signal by changing certain characteristics of the waveguide, thus producing an optically controlled waveguide phase shifter. For a detailed treatment of this area see Cheung et al., "Optically controlled coplanar waveguide phase shifters," IEEE Trans. Microwave Theory Tech., vol. MTT-38, pp. 586–589, 1990, and Vaucher et al., "Theory of optically controlled millimeter-wave phase shifters," IEEE Trans. Microwave Theory Tech., vol. MTT-31, pp. 209–216, 1983.

Another prior art way to produce fast microwave signals was recently reported by Savage et al. in "Frequency Upconversion of Electromagnetic Radiation upon Transmission into an Ionization Front," Physical Review Letters, vol. 68, Feb. 1992. This paper describes an experiment where an optically induced moving ionization front in a gaseous medium interacts with an impinging microwave signal, producing an up-shifted signal. Source radiation at 35 GHz was up-converted to 116 GHz when an ionizing laser pulse was propagated through a resonant microwave cavity. However, the tens of mJ of optical pulse energy used was inadequate to produce a true reflective plasma at microwave frequencies, giving up-shifts different than those predicted by a simple Doppler effect. The up-conversion under these conditions was rather inefficient, being less than 1% at 116 GHz.

An ideal situation for efficient frequency up-conversion would be to produce an optically induced moving ionization front which is sufficiently dense to give complete reflection for an impinging electromagnetic signal. Such a case is analogous to the reflection of electromagnetic radiation from a moving mirror, which will give a Doppler shift dependent on the mirror's velocity. The up-conversion factor due to the relativistic Doppler effect in the rest frame of the observer for an ideal reflecting "front" moving toward the impinging electromagnetic radiation is given by equation 1 which is written and plotted in FIG. 1. The velocity of the electromagnetic radiation in the medium is c and the velocity of the moving reflecting front is v. As the velocity of the reflecting boundary becomes a significant fraction of the velocity of the electromagnetic radiation, very large up-shifts will occur.

Because of the technological difficulty of producing fast laser pulses of sufficiently high energy to create a truly reflective ionization front in a gas, frequency up-conversion by the pure Doppler effect has not previously been achieved. The low efficiency up-conversion demonstrated by Savage et al. was due to a plasma-microwave interaction which is a superset of the Doppler effect.

SUMMARY OF THE INVENTION

The present invention uses energy beam illumination, preferably laser, to generate a moving conducting boundary in a semiconductor, preferably in a waveguide, which up-shifts an impinging electromagnetic signal via the relativistic Doppler effect. Each Fourier frequency component of the impinging signal is up-shifted similarly, giving temporal compression of the reflected signal when the interaction time of the optically-induced conducting boundary is as long as the duration of the original signal. For example, a gaussian microwave pulse of 1 ns duration travelling at 110.8 the speed of an impinging photo-generated plasma "short" in a semiconductor produces an up-shift of 9 times as predicted by equation 1 shown in FIG. 1, and translates into a temporal pulse compression to 0.11 ns. Furthermore, since pulse energy is conserved, a narrowing of the pulse gives a concomitant increase in peak pulse amplitude of 9 times.

The great advantage of using a semiconductor as the interacting medium is that the generation of laser or electron beam induced plasmas is highly efficient compared to a gas, which allows the production of moving plasma boundaries reflective to electromagnetic radiation with modest energy requirements. Also, the semiconductor can be conveniently used as a substrate for many common microwave or optical waveguide geometries, and allows for compact configurations, including microwave cavities.

To determine the optical energy required in a semiconductor to produce adequate plasma densities, the relation of equation 2 is used, $$n = (1-R)\alpha E(hc/\lambda)^{-1}[1-\exp(-\alpha z)] \qquad (2)$$

where n is the photo-generated plasma density in $cm^{-3}$, R is the reflection loss off the semiconductor, $\alpha$ is the absorption coefficient in $cm^{-1}$, E is the optical energy density in $J/cm^2$, $hc/\lambda$ is the photon energy, and z is the depth of the absorbing medium. Using parameters for the semiconductor GaAs, the absorption coefficient is 2000 $cm^{-1}$ (equivalent to an absorption depth of 5 $\mu m$) at a wavelength of 877 nm, the material reflection loss is 30%, and the thickness is assumed to be 1 mm. For the coplanar strip waveguide, discussed in more detail later, useful reflections of microwave energy are achieved with plasma densities of $10^{15}$ $cm^{-3}$. From equation 2, this corresponds to an optical energy density using the above parameters of only 162 $nJ/cm^2$. Fast laser pulses in the tens of mJ range produce semiconductor plasma densities greater than $10^{18}$ $cm^{-3}$.

The generation of photocarriers in a semiconductor is an intrinsically fast process. The electronic transition energy from the valence to conduction band in semiconductors is a few electron volts, thus the production of an electron-hole pair in the material following the absorption of a photon can be as short as femtoseconds. Thus, photo-induced semiconductor plasma densities easily track the rise time of sub-picosecond laser pulses.

The core of the invention is the generation in a semiconductor of a plasma moving at relativistic speeds dense enough and with a sharp enough boundary to reflect electromagnetic signals of frequencies ranging from radio through light. The impinging radiation can be propagating freely through any medium before entering the semiconductor or it can be channelled by any form of waveguide that will allow transmission into the semiconductor. The semiconductor itself can be formed as a waveguide. The plasma can be swept toward the impinging signal to achieve a Doppler reflection, or it can be swept from behind at a speed faster than the signal to compress the signal.

Numerous geometries of semiconductor microwave waveguides can be used to accommodate an energy beam induced moving plasma, including, for example, the coplanar strip geometry in FIG. 2 and the microstrip geometries shown in FIGS. 3 & 4. In all of these geometries, the illumination can occur along the side (or top) of the waveguide, being swept across the guide to produce the moving plasma by deflection of an electron beam, by an electro-optic deflection of laser beam, or passively, through an optical element to the side of (or above) the waveguide such as a prism, which will control the effective sweep velocity for an incident distributed optical wavefront. The laser has a wavelength which maximizes the localized plasma density between the waveguide conductors. In the case of the coplanar strip (CPS) geometry shown in FIG. 2, the wavelength is chosen to give an optical absorption deep enough to "short-out" the field below and between the waveguide conductors 6, yet shallow enough to create a small volume of plasma between the conductors which effectively raises the density of photocarriers, thus increasing the reflection properties of that region to a microwave signal. An advantage of the coplanar strip geometry is that the relatively shallow absorption depths required translate into very high photocarrier densities since the incident optical energy is absorbed in a relatively small volume.

In the case of the microstrip geometry illuminated from the side, the wavelength is chosen for a particular semiconductor to give an absorption depth sufficient to optically "connect" the upper and lower electrodes, giving again a reflective short. To facilitate this in the stripline configuration of FIG. 3, the upper electrode 18 is semi-transparent to the incident optical energy.

Instead of illuminating the semiconductor from the side (or above), the laser illumination can be propagated in the same longitudinal direction as the electromagnetic signal as in FIG. 6 to produce a reflective boundary. For most applications, this is not the preferred embodiment since there is a strong tradeoff between the absorption of the semiconductor and the laser energy requirements. Though a higher material absorption will give a denser plasma for a given laser wavelength, too high an absorption will greatly attenuate the laser beam before it traverses the waveguide.

One method of extracting the up-shifted "output" signal is accomplished with a directional coupler 42 as shown in FIG. 7. The burst of microwave energy to be up-shifted travels down a microwave waveguide from the source, passing through the coupler and impinging onto the optically generated plasma front. The directional coupler then routes the reflected and up-shifted signal into the output coaxial cable 44. Since the laser pulse is electronically triggered, the launching of the input signal is synchronized with the laser pulse to achieve the maximum time of interaction between the plasma and the input signal that the length of the semiconductor waveguide will allow.

In an alternate microwave waveguide embodiment, the invention can be used to originally generate fast electrical signals, without the use of an external signal generator, by applying a biasing voltage across the waveguide and then sweeping the laser at high speed. The laser allows conduction at the point of illumination which, because the point is moving at relativistic speeds, produces a shock wave electrical signal.

For a further treatment of the invention and its advantages, reference should be made to the subsequent descriptions as they relate to the accompanying drawings.

BRIEF DESCRIPTION OF THE DRAWINGS

FIG. 16 shows a microstrip waveguide with an applied voltage across the conductors.

FIG. 17 shows a CPS waveguide with an applied voltage across the conductors.

FIG. 18 shows a microstrip waveguide cavity with a semi-transparent top conductor.

FIG. 19 shows a CPS waveguide with an opaque coating on the outside of the conductive strip gap.

DETAILED DESCRIPTION OF THE PREFERRED EMBODIMENTS

Figure 8:
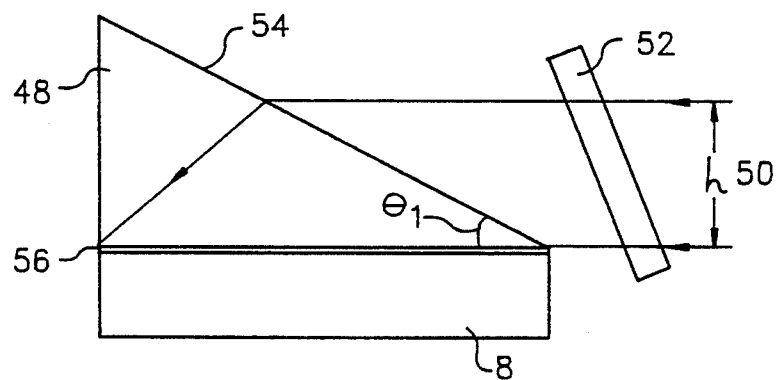
FIG. 8 shows the method of passively sweeping the laser illumination across a waveguide using a prism.

A key facet of the invention is the method of achieving a laser illumination sweep across the semiconductor waveguide to produce the moving plasma. A requirement of the laser sweep is that it be sufficiently fast to give relativistic velocities of the reflecting plasma front. One preferred way to achieve this is to use a prism 48 that is optically coupled to the semiconductor waveguide as shown in FIG. 8. A collimated laser beam 50 of height h is incident on a cylindrical lens 52 which focuses a "line" of laser illumination through prism onto the waveguide. Alternately, a collimated laser beam with sufficient power may be used without focusing. The diameter of the collimated laser beam is chosen such that the top portion of the beam just reaches the end of the waveguide after being refracted by the prism. In the case of the CPS waveguide geometry, this illumination line is focused into the conductive strip gap along the length of the waveguide. The cylindrical lens is tilted with respect to the incident laser beam in order to achieve the same focus along the length of the waveguide. In order to maximize the optical throughput, an anti-reflection coating 54 is used on the top surface of the prism, and to prevent total internal reflection at the interface between the prism and the semiconductor substrate 8, optical index matching material, preferably fluid, is used between these components. The index matching substance 56 must have a refractive index somewhere between the index of the prism and the semiconductor substrate for the laser wavelength used.

The effective velocity of the optical sweep across the waveguide is the waveguide length divided by the time it takes the top "ray" of the line illumination to hit the far end of the waveguide measured from the time the bottom "ray" hits the near end of the waveguide. This effective velocity for a given length of waveguide is controlled by the prism angle $\Theta_1$ in FIG. 8 and the prism's refractive index. The benefit of the prism is that it allows the sweep speed to be slowed down compared to the effective sweep speed that would occur if laser illumination were incident at an angle to the waveguide in the absence of a prism. Otherwise, v/c in equation 1 could be greater than unity, pushing the effect of the microwave-plasma interaction out of the regime of the Doppler effect and into the regime of shock wave formation. The propagation of the laser beam parallel to the waveguide surface at 50 gives a greater degree of slow-down of the illumination sweep than if the laser beam were illuminating the prism at an angle, though either configuration can be used.

A second preferred method of achieving relativistic sweep speeds uses electro-optic deflection of a laser beam across the waveguide. Using certain materials whose refractive index varies with applied electric field, it is possible to make devices which can deflect a laser beam with a sweep speed that depends on the rise time of the electrical signal being applied to the electro-optic material. The company ConOptics in Danbury, Conn. manufactures an off-the-shelf electro-optic beam deflector that gives deflections of 0.26 degrees or more for applied voltages of 3000 volts. The speed at which the deflection occurs depends on the rise time of the applied electrical signal and the resistance-capacitance (RC) time constant of the device. ConOptics model 310A has a capacitance of 100 pF and is preferably driven with an off-the-shelf voltage pulser from Kentech Instruments Ltd. of South Moreton, England which is configured with an internal source impedance of under 1 ohm and provides peak voltages well in excess of 3000 volts. The RC time constant of 100 pF with one ohm is 100 ps. Since this voltage pulser has a rise time of 100 ps, the time $\tau d$ for a complete deflection to occur is approximately 100 ps. Alternatively, the electro-optic beam deflector is configurable as a "travelling-wave" device, meaning that the electro-optic device will act like a transmission line to the applied voltage signal rather than a lumped element capacitor, thus allowing the deflection speed to equal the rise time of the applied electrical signal.

Figure 9:
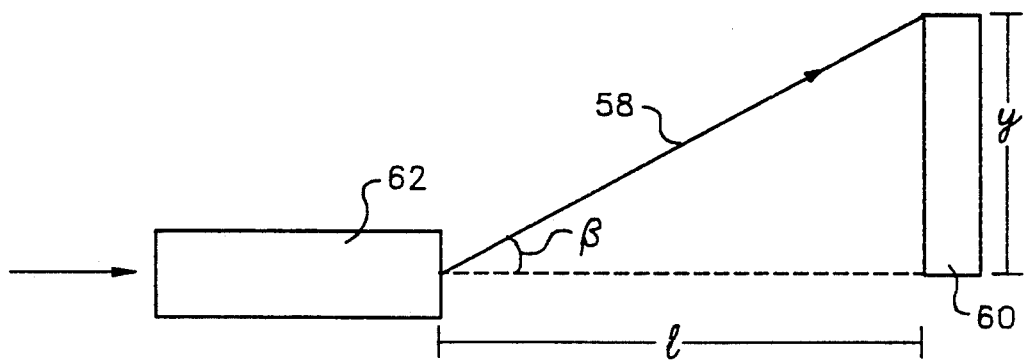
FIG. 9 shows the method of electro-optically sweeping the laser illumination across a waveguide.

Translating these known parameters into an effective sweep velocity is clarified by FIG. 9. The effective sweep velocity of the laser beam 58 across the waveguide 60 of length y is given by equation 3, $$V_{sweep} = y/\tau d = (l/\tau d)\tan(\beta) \quad (3)$$

where $\beta$ is the maximum deflection angle, l is the distance from the electro-optic deflector to the waveguide, and $\tau d$ is the deflection time of the beam through the angle $\beta$. Thus, the sweep velocity can be varied by simply changing the distance l and/or the electrical rise time of the applied voltage to the electro-optic deflection device 62. As an example, a $\tau d$ of 100 ps for $\beta = 0.26$ degrees, at a distance of l=2 meters, translates into a sweep velocity of 9E7 m/s. The total scanning distance for these parameters corresponds to the waveguide length, which is 9 mm.

An alternate method to sweep the laser illumination across the microwave waveguide uses phased-array optical beam steering. By controlling phase differences between different portions of the same laser beam and-/or phase differences between individual lasers in an array of lasers, it is possible to steer the laser beam in the far field. An example of such phase control uses an array of optical waveguides whose relative phase relationships for a guided laser beam can be changed electro-optically or all-optically using the Kerr effect. Since the electro-optic effect and Kerr effect are very fast phenomena, the resulting rapid beam sweep velocity in the far field are suitable for this invention. An example of such a device is given in a recent paper by H. K. Chiang et al., "The Analysis of a Phased-Delayed Optical Two-State Switch," IEEE Photonics Technology Letters, vol. 4, p. 368, 1992.

As an alternative to using a laser, the semiconductor plasma may be produced using electron beam illumination. The methods of sweeping electron beams are well known, and can be used to create a moving deflecting plasma in a semiconductor waveguide in a manner completely analogous to a photo-induced plasma wave. The similarities between these two types of plasma-inducing illuminations is paralleled by the similarities between optically controlled semiconductor switches and electron beam controlled semiconductor switches, and is exemplified in the paper by D. C. Stoudt et al., "The Recovery Behavior of Semi-Insulating GaAs in Electron-Beam-Controlled Switches," IEEE Transactions on Electron Devices, vol. 37, p. 2478, 1990.

Figure 2:
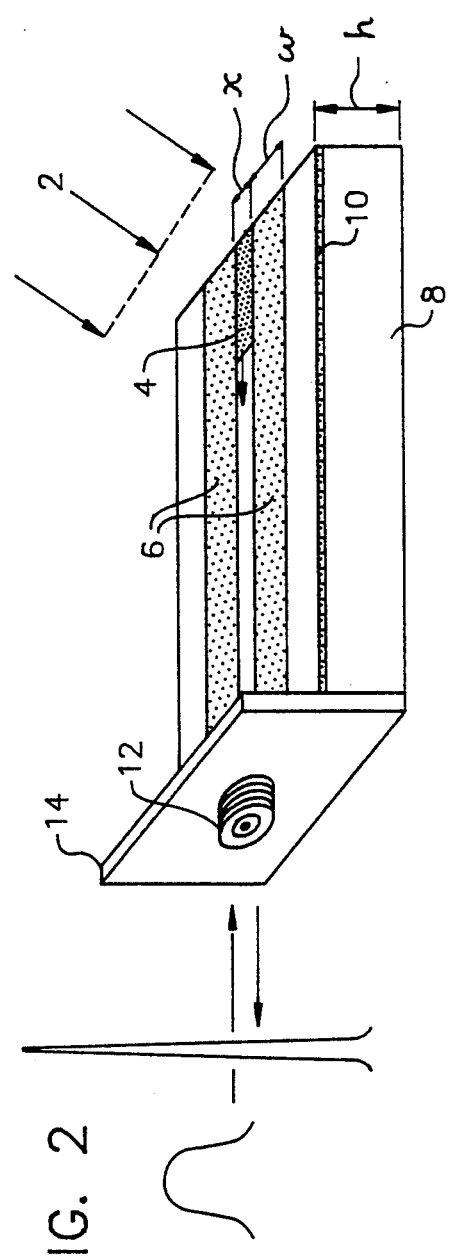
FIG. 2 shows a coplanar strip (CPS) waveguide showing a compressed output pulse after reflecting off the optically-induced moving plasma.

A preferred embodiment of the invention uses the so called "coplanar strip" (CPS) waveguide geometry shown in FIG. 2. The laser illumination front 2 is depicted in a generic way——the medium above the waveguide may actually be a prism or could be air with the laser beam swept electro-optically. Placing a real conductive short across the conductive strips 6 in FIG. 2 will cause an impinging microwave signal to be reflected. Illuminating a region in the gap with laser light produces an optically generated electron-hole plasma which acts like a conducting short. By sweeping a fast laser pulse rapidly across the gap, a moving reflecting "short" or plasma front 4 is produced which up-shifts the impinging microwave signal. A configurational description of CPS waveguide design that allows extraction of the desired up-shifted signal follows.

A block of semiconductor GaAs, 9 cm long and 0.6 mm thick is used as a waveguide substrate 8 as shown in FIG. 2. Gold conductive strips 6 of 2 $\mu$m thickness and 0.5 mm wide are interfaced to the bulk substrate 8 through a doped n+ layer 10 that has been implanted on the substrate surface. Such preparation is common when making electrical contact with GaAs. The GaAs is preferably of a semi-insulating nature (commonly called SI-GaAs) in order to mitigate waveguide losses. A space between the strips of 48 $\mu$m produces a coplanar strip waveguide characteristic impedance of 50 ohms, and a loss that is approximately 0.3 dB/cm at 10 GHz. The connector 12 is a common ssma type waveguide to coax connector mounted to a bulkhead 14 which allows the CPS waveguide to be connected to a coaxial cable. The inner and outer conductors of the ssma connector 12 are attached to the conductive strips 6 of the waveguide and are held in place by the bulkhead 14. The bulkhead is secured to the waveguide using epoxy.

Figure 7:
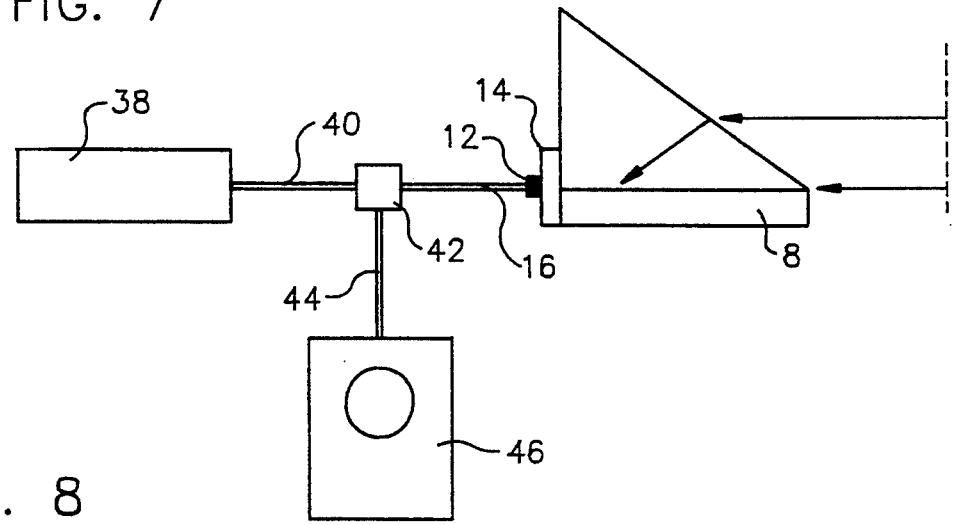
FIG. 7 shows the configuration used to extract the up-shifted output signal.

Referring to FIG. 7, a pulse generator such as the Kentech model ASG1 pulser 38 produces a 0.4 ns full-width half-maximum (FWHM) gaussian voltage pulse which travels down a 50 ohm coaxial cable 40 through the broadband directional coupler 42. A suitable directional coupler such as model CWV-12R-33G made by Merrimac of West Caldwell, N.J. is used, which has a bandwidth range of 1–65 GHz. The pulse travels from the directional coupler via another 50 ohm coax 16, which feeds the input pulse into the coplanar waveguide through the attached ssma connector 12 that is mounted to the bulkhead 14. The pulse generator has an additional electrical output which is synchronized with the electrical pulses being generated. This additional output is used to trigger the production of laser pulses such that the beginning of the 0.4 ns input pulse impinges on the laser-generated plasma front at the far end of the CPS waveguide. Proper timing is achieved using cable delay lines to the laser trigger inputs, and/or variable digital delay instruments such as the Stanford Digital Delay DG-535. In this manner, the total interaction time of the impinging microwave pulse and moving plasma is maximized. This time is simply the waveguide length divided by the velocity of the sweeping laser illumination. The up-shifted and compressed reflected pulse travels out the CPS waveguide through the ssma connector and into the directional coupler 42, which routes the up-shifted output into the 50 ohm coaxial cable 44 and into the oscilloscope 46 for viewing. This entire process is repetitive, since the Kentech model generator operates at up to 1 kHz and the laser is easily triggered. The constraints on the maximum repetition frequency are the photoconductive carrier lifetime in the semiconductor and the maximum repetition rate of the pulse generator. The former depends on the semiconductor which for normal GaAs, is much less than 1 $\mu$s.

In alternative embodiments any electromagnetic signal source can be used in place of the specified pulse generator 38 in FIG. 7, including, for example, a photoconductive switch of the variety previously discussed.

The preferred laser wavelength is 880 nm, near the GaAs bandgap. The laser pulse has a rise time in the picosecond range, thus producing a sharp plasma front in the GaAs. A significant reflection will occur for laser pulse energies as low as 200 nJ. Higher energies ensure that all frequency components of the input pulse are upshifted by the same factor, thus giving scale-invariant pulse compression with a concomitant increase in peak amplitude.

The velocity of the microwave signal in the CPS geometry is $c(e_r')^{-0.5}$, where c is the speed of light in a vacuum, and $e_r'$ is substrate given roughly by the effective relative dielectric constant of the waveguide substrate given roughly by $(e_r+1)/2$, where $e_r$ is the actual relative dielectric constant of the material. GaAs has an $e_r$ of 12.9, giving a signal velocity down the waveguide of about 1.18E8 m/s. A 75 degree prism with a refractive index of 2.8 gives a laser illumination sweep of about 1.08E8 m/s across the waveguide. The resulting up-shift factor, as predicted from equation 1, is about 23, and manifests itself as a compressed pulse on the oscilloscope. In use, the oscilloscope is replaced by a desired load depending on the application.

Figure 10:
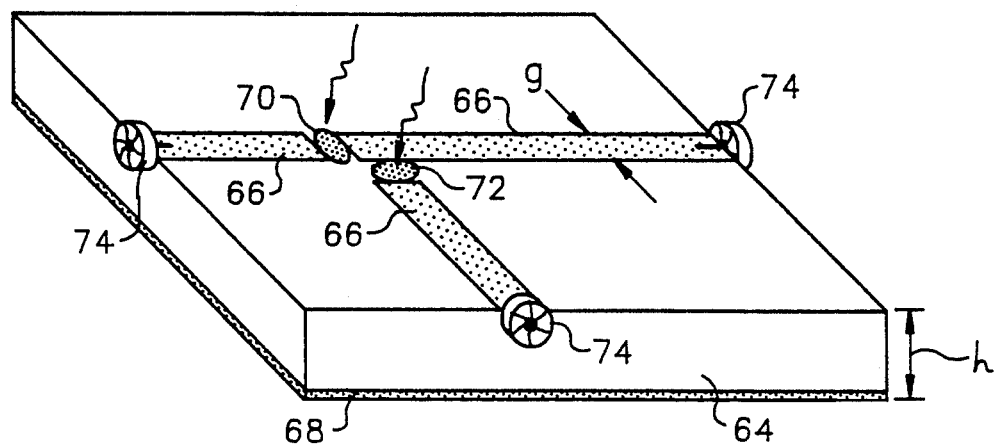
FIG. 10 shows a three port device which optically switches the routing of a microwave signal.

There are a number of alternative embodiments to the configuration of FIG. 7. In a first alternative, the directional coupler 42 is replaced with an active optical switch for extracting the desired up-shifted output signal. Such a switch is shown in FIG. 10. The substrate 64 is a semiconductor, preferably GaAs, upon which are deposited conductive strips 66 on top and a metal ground plane 68 on the bottom, thus making microstrip waveguides. The connectors 74 are "ssma" type, the dimension g is 0.43 mm and the dimension h is 0.6 mm give a microstrip characteristic impedance of 50 ohms. The regions indicated by shaded circles represent gaps in the conductive strips that are illuminated with laser light in order to electrically connect the various ports. The gap resistance between the conducting lines is $$R_{gap}=l_{gap}^2/(Ne\mu) \qquad (4)$$

where $l_{gap}$ is the separation between conductors, e is the electron charge, $\mu$ is the dominant carrier mobility of the semiconductor, and N is the total number of photoinduced charge carriers and is proportional to the laser energy. Thus, the gap 70 is laser illuminated just long enough to allow passage of the input signal to be launched into the waveguide of FIG. 7, and then the gap 72 is laser illuminated to route the up-shifted output pulse toward the oscilloscope. Again, the lasers are synchronized with the pulse generator, allowing repetitive operation.

Figure 11:
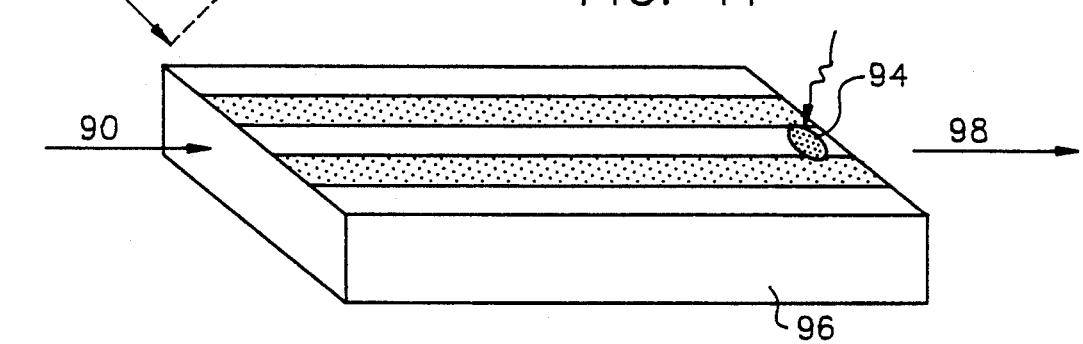
FIG. 11 shows a coplanar strip waveguide with a laser-induced reflecting short at the end.

An alternate configuration from FIG. 7 that avoids using a directional coupler or switch is shown in FIG. 11. The input signal 90 to be up-shifted is coupled into the CPS waveguide using a microwave waveguide that is connected between the signal source and the CPS. The waveguide could, for example, be a coaxial cable as referred to earlier which mates with an ssma type connector mounted and electrically connected to the CPS. Stationary laser illumination of the proper intensity, wavelength, and timing produces a conductive plasma 94 near the end of the CPS waveguide which reflects the impinging microwave signal back toward the beginning of the waveguide. A second, synchronized laser illumination 92 is then swept using one of the methods described earlier to produce a moving conductive plasma which reflects and up-shifts this microwave signal. The laser illumination that produced the conducting "short" 94 has since been extinguished so as to let pass the up-shifted output signal 98, which might be routed to some desired load via a coaxial cable electrically interfaced to the end of the CPS waveguide using standard connectors. The semiconductor substrate 96 must have a carrier recombination sufficiently fast to prevent a lingering plasma at the location of the initially created short 94 that would attenuate the output signal, preferably "low temperature grown" GaAs. For a 50 ohm CPS waveguide, the dimensions would be the same as in FIG. 2. A laser of 880 nm is used to illuminate the gap 94. The concept of this configuration could be used with any waveguide geometry.

Figure 3:
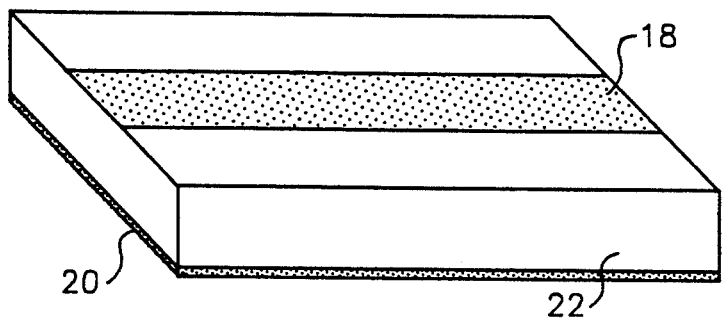
FIG. 3 shows a microstrip waveguide geometry with a semi-transparent top conductor.

Other alternative embodiments use different types of semiconductor waveguides. One such alternative uses a microstrip waveguide as shown in FIG. 3, again using either method of illumination sweep discussed previously. The upper conductive strip 18 is semi-transparent to allow laser illumination to pass through. The wavelength of the laser illumination, about 895 nm, is longer than for the CPS geometry since a greater absorption depth is required in the substrate 22 in order to get conduction between the upper conductive strip 18 and the metal ground plane 20. The upper conductive strip is made transparent by one of three alternative methods: a thin layer of deposited gold, a grid pattern, or by using a highly doped n+ layer which has a doping density sufficiently high that it acts like a conductor. Such n+ layers can be doped up to approximately 4E18 $cm^{-3}$. Such transparent strips may, of course, be used with any of the waveguide geometries. The advantage of the microstrip geometry is an enhanced voltage standoff ability over the CPS design due to the wider conductor spacing.

Figure 4:
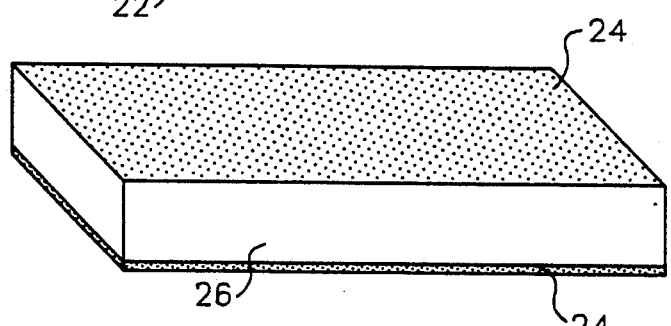
FIG. 4 shows a modified microstrip waveguide with a narrow ground plane to allow side illumination.

In another alternative waveguide, shown FIG. 4, instead of using a transparent or semi-transparent upper conductive strip, the laser illumination comes in from the side, between the metallization layers 24, into the semiconductor substrate 26. In order to accommodate laser illumination in this way, the lower metallization layer or ground plane is preferably made narrower than the geometry of FIG. 3.

Figure 5:
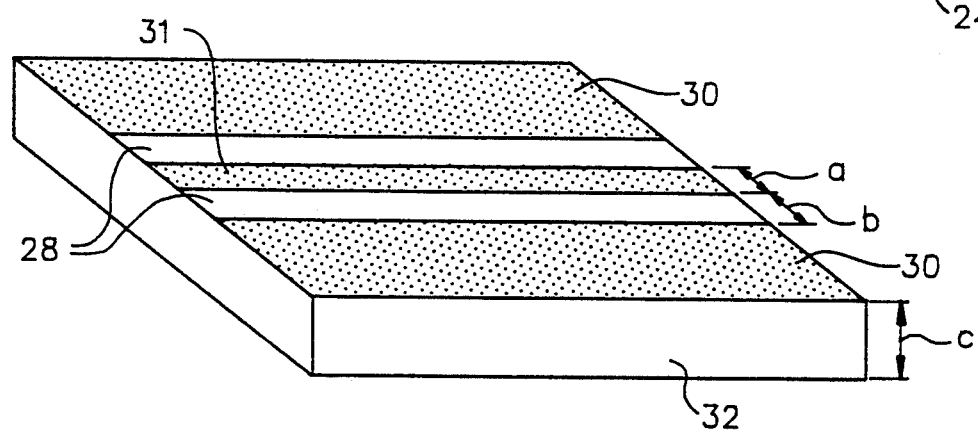
FIG. 5 shows a coplanar waveguide (CPW) geometry.

Another alternative waveguide geometry is the coplanar waveguide (CPW) shown in FIG. 5. The dimensions a, b, and c are chosen for the desired characteristic impedance, loss factor, dispersion, etc., using the parameters appropriate for the type of semiconductor substrate 32. The laser illumination is swept across both conductive strip gaps 28 in the usual manner described previously. Again, the conductive strips 30 and 31 may be semi-transparent.

Figure 6:
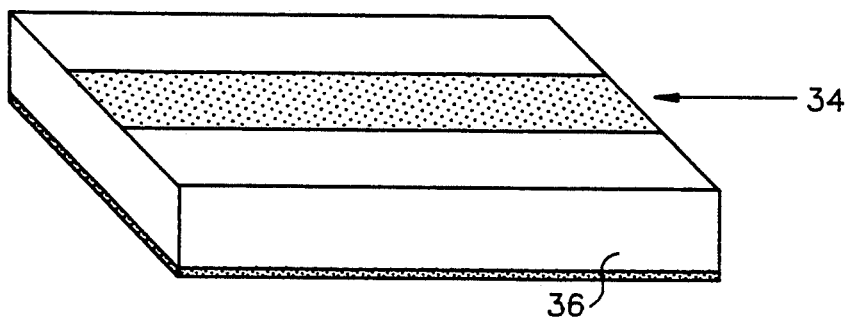
FIG. 6 shows a microstrip waveguide with laser illumination through the bulk semiconductor substrate.

Another alternative embodiment uses microstrip with laser illumination 34 that propagates on the same axis that the impinging microwave signal travels as shown in FIG. 6. The wavelength of the laser is chosen to give adequate transmission through the length of the microstrip substrate 36 while allowing enough absorption to produce a sufficiently high plasma density to create a reflecting front. This tradeoff renders this design much less desirable. However, using materials such as silicon and hydrogenated amorphous silicon at wavelengths between approximately 1.5 and 2 um, it is possible to get absorption coefficients down below 0.4 $cm^{-1}$. This allows transmission through a 10 cm microstrip waveguide and provides enough absorption to produce an adequate photo-induced moving plasma for sufficiently high incident laser pulse energies.

Figure 12:
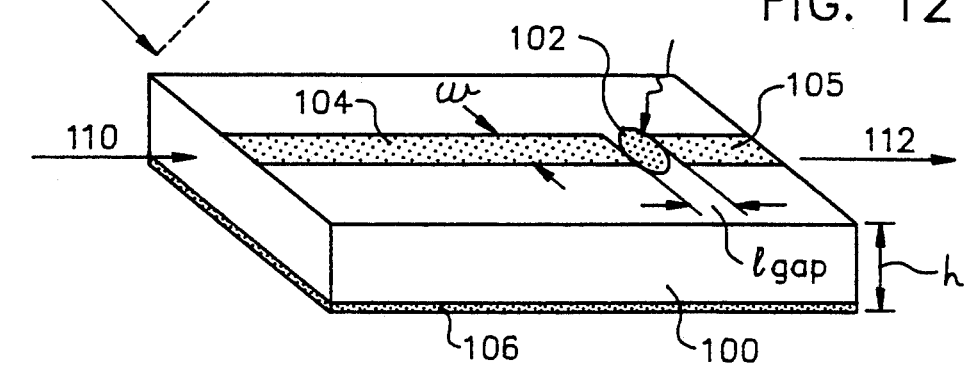
FIG. 12 shows a microstrip waveguide with a semi-transparent top conductor and a reflecting gap when not illuminated.

Another alternate embodiment uses the microstrip configuration of FIG. 12. A microwave input signal 110 is coupled into the microstrip in the usual way. The input microwave signal reflects off the open end of a gap with spacing $l_{gap}$ in the transparent or semi-transparent top conductor 104 during a time when the stationary illumination 102 is not present. The reflected signal which now travels back toward the input is reflected again, this time by a moving conducting plasma front in the semiconductor created by a sweeping laser illumination 108 achieved using one of the methods previously described. The resulting up-shifted signal is routed to the end of the microstrip 105 using laser illumination 102 that effectively electrically shorts the gap. The up-shifted output signal 112 is coupled out of the microstrip in the usual way using an ssma connector mounted and electrically connected to the end of the microstrip. A coaxial cable with a mating ssma connector then routes the up-shifted signal to a desired load. The microwave input signal and laser pulse illuminations are synchronized to give the timing required. Proper timing can be achieved using cable delay lines to the laser trigger inputs, and/or variable digital delay instruments such as the Stanford Digital Delay DG-535.

As described previously, the top conductor in the microstrip is a highly doped layer deposited on the semiconductor substrate 100 which acts like a conductor, or a semi-transparent metallization deposited atop the highly doped layer. The resistance of the illuminated gap as a function of wavelength, spacing, and semiconductor characteristics is given by equation 4.

A preferred embodiment of the above uses dimensions w=0.43 mm and h=0.6 mm in FIG. 12 to produce a microstrip characteristic impedance of 50 ohms for a semi-insulating GaAs substrate 100. The top conductors 104, 105 are a highly doped n+ region approximately 10 μm thick, and the ground plane 106 is a gold metallized region 5 μm thick over a highly doped n+ layer. $l_{gap}$=0.3 mm, and the laser illumination 102 in the gap has a wavelength of about 880 nm and an energy per pulse sufficient to give a gap resistance (equation 4) much smaller than 50 ohms. The duration of this laser pulse is as long as the temporal length of the up-shifted signal to be output. The swept laser pulse illumination has a wavelength of about 895 nm and has an energy per pulse which is hundreds of μJ or greater. Again, the higher the laser pulse energy, the denser the photo-generated plasma and the higher the reflection coefficient for microwave frequencies.

Figure 13:
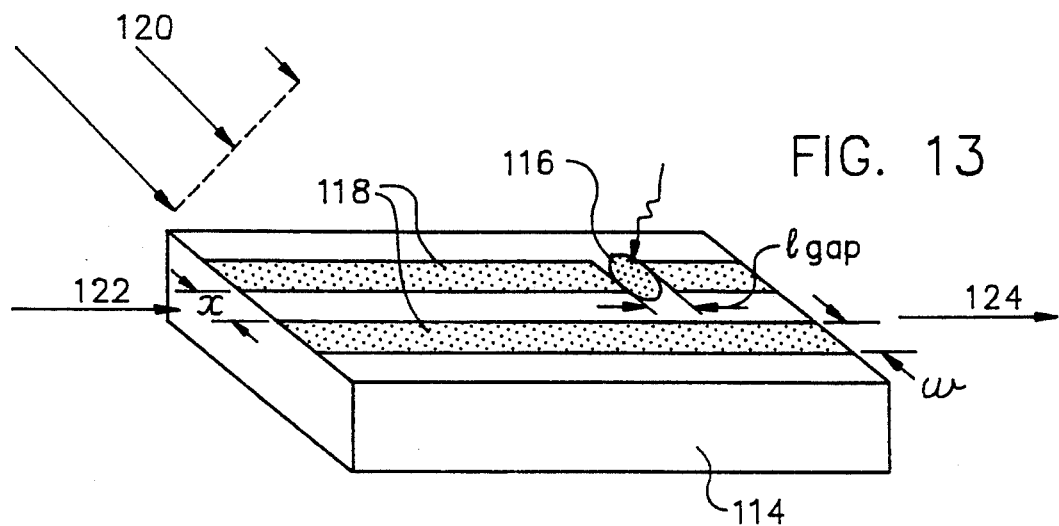
FIG. 13 shows a CPS waveguide with a reflecting gap when not illuminated.

A related alternate configuration using a coplanar strip (CPS) geometry is shown in FIG. 13. This geometry works in an exactly analogous manner to the previously described microstrip waveguide. Again, a microwave input signal 122 coupled into the CPS input travels down the waveguide and is reflected at the gap near the end of the CPS during a time when the gap is not illuminated. The reflected signal propagates back toward the CPS input where it is reflected by a moving plasma generated by laser illumination 120 swept at a velocity v by one of the previously described methods. The gap illumination 116 is then applied to extract the up-shifted output signal 124.

A preferred embodiment of the above uses a semi-insulating GaAs substrate 114 with a highly doped n+layer upon which is deposited 2 μm thick gold conductive strips 118. For a characteristic CPS impedance of 50 ohms, the dimensions are w=0.5 mm×=48 μm, and h=0.6 mm. The gap spacing $l_{gap}$ is approximately 0.25 mm. The laser illumination in the gap has a wavelength of about 880 nm, and a pulse energy which gives an impedance much smaller than 50 ohms as given by equation 4. The swept laser pulse illumination is at a wavelength of about 880 nm, and will have an energy per pulse which produces a plasma density sufficient to act like a reflector to an impinging microwave signal. The resulting plasma density for a given optical energy density and semiconductor is given by equation 2.

The stationary laser illumination depicted in various configurations may be achieved using either an optical fiber coupled between the laser and the gap or an externally focused laser beam.

Without the stationary laser illumination in the gaps of the configurations of FIGS. 12 and 13, some of the input signal will "leak" into the output through the effective gap capacitance. Since this leakage increases proportionally with frequency, the gap capacitance can be utilized as a high-pass filter to allow the up-shifted signal to be coupled to the output end of the waveguide. The general consideration for such a design is to make the gap spacing sufficiently large so the waveguide acts like a reflecting open at the gap, while keeping the gap spacing sufficiently small to give an effective gap capacitance which passes the up-shifted output signal. The effective gap capacitance for a microstrip is given by Bahl and Bhartra in chapter 2 of the book "Microwave Solid State Circuit Design," John Wiley & Sons, 1988.

Again, the previously described concept is not limited for use with microstrip and CPS waveguides, but can be used with slotline waveguides, coplanar waveguides (CPW), geometries such as FIG. 4 where the illumination comes in from the side as described earlier, stripline waveguides, coaxial waveguides, etc.

Figure 14:
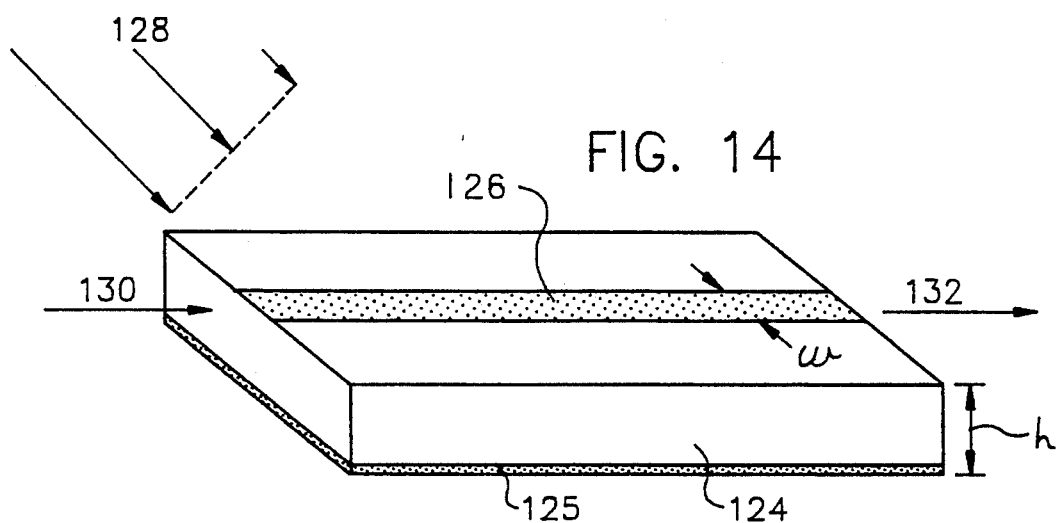
FIG. 14 shows a microstrip waveguide with a semi-transparent top conductor and swept laser illumination that travels in the same direction as the input signal.

Another embodiment allows the production of shock waves using a microstrip waveguide geometry as shown in FIG. 14. A microwave signal 130 is input in the usual manner into the input of the microstrip. After the microwave signal begins travelling down the waveguide, laser illumination 128 is swept through the semi-transparent top conductor 126 at a velocity slightly greater than the velocity of travelling microwave. Since the photo-generated moving plasma pushes up against the travelling microwave signal with a greater velocity than the microwave signal itself, a shock wave results. The shock wave has higher frequency components than the original input signal, thus giving an up-shifted output signal 132. In order to choose the velocity of the laser illumination sweep, the microwave signal velocity is given by $$v_s = c (e_{eff})^{-0.5}, \quad (5)$$

where c is the speed of light in a vacuum and $e_{eff}$ is the effective dielectric constant for a microstrip which can be calculated for a given geometry using the formulas in chapter 2 of "Microwave Solid State Circuit Design," by Bahl and Bhartia, John Wiley & Sons, 1988. For a 50 ohm waveguide using a 0.6 mm thick (h) semi-insulating GaAs substrate with a gold ground plane 125 interfaced to the GaAs in the usual way, the top conductive strip in FIG. 14 is 0.43 mm wide.

Figure 15:
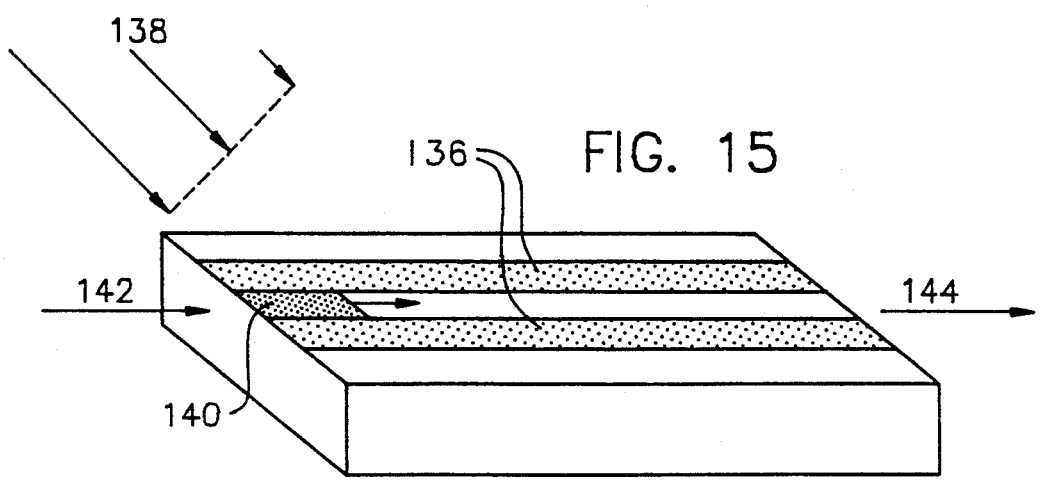
FIG. 15 shows a CPS waveguide with a swept laser illumination that travels in the same direction as the input signal.

The coplanar strip (CPS) configuration of FIG. 15 works in a completely analogous manner to FIG. 14. A laser-induced moving plasma 140 sweeps across the gap between the conductive strips 136 and pushes up against a microwave signal 142 that was launched into the waveguide in the usual manner. The laser sweep velocity is again chosen to be slightly greater than the microwave signal velocity to produce an up-shifted shock wave output 144. The microwave signal velocity is given for a CPS waveguide in the book previously referenced. For a 50 ohm CPS waveguide on a GaAs substrate, the dimensions in FIG. 15 match those of FIG. 2.

In yet another embodiment, a voltage is applied to the waveguide in order to produce a photoconductive signal upon application of a pulsed laser illumination. FIG. 16 depicts such a configuration using a microstrip waveguide with a semi-transparent top conductor 148. A voltage source 153, either DC or pulsed, of any voltage as appropriate for the application, is applied between the top conductor 148 and the ground plane 151 during the time the sweeping laser illumination 150 is incident on and through the top conductor and into the semiconductor substrate 146. The photocarriers generated between the top and bottom conductors are swept out into the external circuit by the applied voltage, producing a voltage pulse that travels down the waveguide at a speed characteristic of the waveguide, and with an electrical rise time that approximately tracks the rise time of the optical pulse. This voltage pulse propagates down the waveguide even if the laser illumination 150 hits the end of the waveguide without being swept. When the velocity of the swept laser illumination is faster than the characteristic velocity of the optically generated electrical pulse, the moving plasma overtakes the electrical signal, producing a shock wave output 152 that is up-shifted in frequency compared to the electrical signal that would have been produced if the laser illumination had not been swept. In order to choose the speed of the laser sweep, the characteristic velocity of a signal on the waveguide must be calculated using equation 5. For a 50 ohm microstrip, the dimensions for FIG. 14 are used.

A completely analogous embodiment uses the CPS waveguide in the configuration of FIG. 17 with a voltage source 153 applied between the conductive strips 156. Again, the swept laser illumination 157 produces a photoconductive electrical signal propagating toward the end of the waveguide and followed by a moving reflective plasma which overtakes the electrical signal thus producing a shock wave output signal 160. A 50 ohm CPS waveguide would use the dimensions of FIG. 2 with a semi-insulating GaAs substrate 154.

The above concept could be used with many different and standard waveguide geometries, not just microstrips and coplanar strips as discussed in the previous examples.

In the arrangements of FIGS. 16 and 17 where a voltage is applied across the waveguide conductors, I have referred to the optically produced electrical signals as "photoconduction". Included within the meaning of "photoconduction" is conduction that occurs in the semiconductor due to optically-induced avalanche. Above some threshold of laser energy and voltage bias, optically-induced avalanche produces a localized semiconductor conductivity much higher than would be possible from similar optical energies in a strictly linear photoconductive semiconductor device.

In another embodiment, the semiconductor waveguide is configured into a cavity or resonator arrangement with a continuous wave (CW) sinusoidal input 76 as shown in FIG. 18. The input sinusoid is coupled into the microstrip in the usual way. The conductors interfaced to the semiconductor substrate 78 are a semi-transparent top conductor 77, metallized top conductors 75, 80, and the usual ground plane 79. The gap 83 capacitively couples the input signal into the central cavity section 77 of length l. When $l=(2n+1)\lambda/4$, the line behaves like a series resistance-capacitance-inductance (RCL) circuit, and when $l=n\lambda/2$, the line behaves like a parallel RCL circuit, where n is a positive integer, and $\lambda=2\pi/\beta$. $\beta$ is the phase constant of the microstrip line and is related to the free-space wavelength $\lambda_o$ of the input sinusoid by $\beta=2\pi(e_{eff})^{0.5}/\lambda_o$, where $e_{eff}$ is the effective dielectric constant for the microstrip geometry using a certain semiconductor substrate. Laser illumination 81 is swept over the central cavity section, preferably electro-optically, at such a velocity as to give a harmonic Doppler upshift of one of the travelling waves inside the cavity section. The backward and forward travelling waves inside the cavity have the frequency of the input sinusoid before interaction with the swept laser illumination. Following the up-shifting plasma-wave interaction, the gap 82 is laser illuminated to dump the stored cavity energy at the up-shifted frequency into the output line 80 and out from the microstrip through the usual ssma connector.

The proper laser sweep velocity is chosen using equation 1 for a wave impinging on a moving reflecting boundary, where the propagating electrical wave velocity c in the waveguide is given by equation 5. Again, the effective dielectric constant $e_{eff}$ for a microstrip waveguide is found in the reference given in the discussion following introduction of equation 5.

Figure 1:
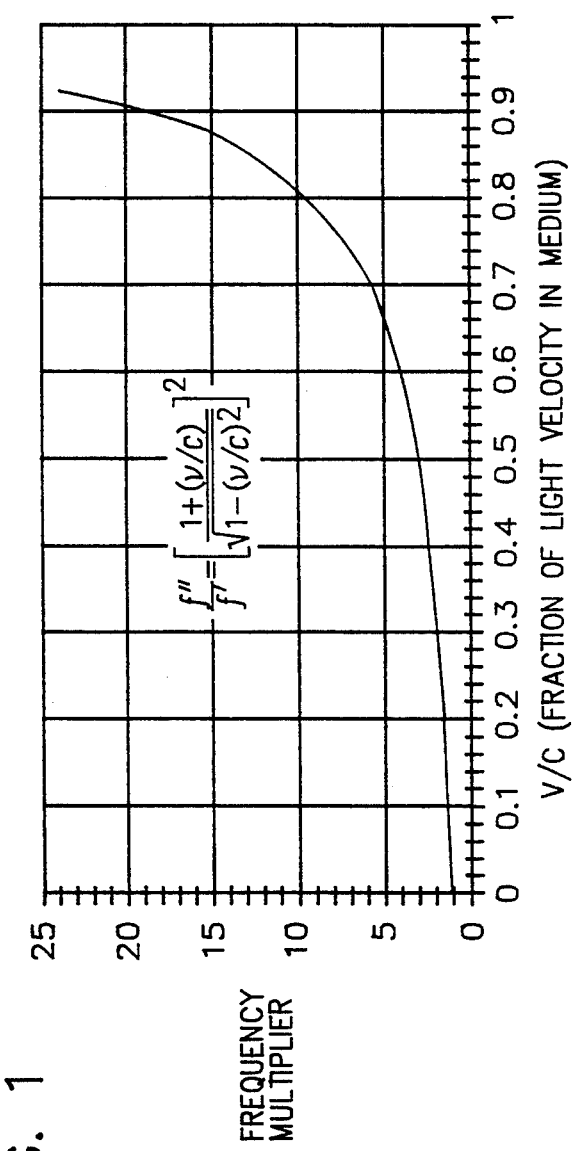
FIG. 1 shows a plot of the frequency up-conversion factor for an electromagnetic wave of velocity c impinging on a reflecting front moving at a velocity v and a statement of the plotted equation.

For the preferred cavity embodiment, a 50 ohm microstrip is realized using a 0.6 mm thick low temperature grown semi-insulating GaAs substrate 78 with top conductive strips 0.43 mm in width. The input gap 83 has a 40 μm spacing and the output gap where stationary illumination sometimes occurs has a spacing of 0.4 mm. The applied input sinusoid is 5 GHz. The effective dielectric constant for this geometry is 8.36, which translates into a waveguide wavelength for 5 GHz of 2,075 cm. Setting the cavity length $l=n\lambda/2$, $l=1.037$ cm for $n=1$. A preferred harmonic of the input sinusoid is 25 GHz. For a Doppler frequency increase of 5, $v/c=0.665$ from FIG. 1. From equation 5 the velocity of the electrical signal in the waveguide is $c=1.038E8$ m/s. Thus, the velocity of the swept laser illumination to satisfy $v/c=0.665$ and give an up-shift to 25 GHz is 6.9E7 m/s. Laser illumination 82 at the output gap dumps the stored and up-shifted cavity energy into the line 80, which is connected to an ssma connector to accommodate a coaxial output cable that routes the signal into some desired load. The GaAs is a low temperature grown variety which has a fast recombination time so that the photogenerated plasma dies out rapidly when the laser illumination is extinguished from a given location on the waveguide.

Though two conductor microwave waveguides such as the coplanar strip, microstrip, slotline, and others commonly use semiconductors such as GaAs for the dielectric separating the conductors, rectangular and circular "single" conductor waveguides can also be made with a semiconductor dielectric inside. Normally, these hollow-pipe guides have air or some other dielectric inside which are completely enclosed with a conductor. Using a semi-transparent conductor such as the types discussed previously on the outside of a semiconductor core, such a guide can accommodate a swept laser illumination, producing a moving reflecting plasma as before to interact with an impinging electromagnetic signal. It is not necessarily required that a true electrical "short" be produced in order to reflect an impinging electrical or electromagnetic signal, since a plasma boundary of sufficient density and gradient can act as a reflector to such radiation. Coupling the electromagnetic energy into the guide is well known and described in most microwave texts.

In a manner quite similar to the description regarding directing the laser pulse through the length of the semiconductor down the same axis as the electromagnetic signal in a microstrip waveguide, the laser illumination can also be directed down the same axis as the electromagnetic signal in a bulk semiconductor that is not in a waveguide. Using the same considerations as in the discussion relating to FIG. 6 with regard to laser wavelength and power, the propagating laser pulse creates a moving plasma boundary which reflects an impinging electromagnetic signal. This impinging electromagnetic signal can be microwaves, light, or other frequencies. An optical semiconductor waveguide can be used to confine the propagation of impinging light energy to be up-shifted. The laser used to create a moving plasma front can be propagated down the same axis of this waveguide or directed in from the side as previously disclosed using electro-optic beam deflection or a passive prism coupled to the optical waveguide. In this embodiment, the swept laser illumination penetrates to the depth of the optical guiding layer in the waveguide from the side and is of sufficient intensity to produce a reflective plasma front to light frequencies, again in an entirely similar fashion to the up-shifting of microwaves.

Finally, in each of the above embodiments in order to keep laser illumination out of areas where it is not desired on the waveguides, an opaque mask is placed on those areas of the waveguides. In the CPS geometry of FIG. 19, the opaque painted regions 170 prevent photocarrier generation in the semiconductor substrate 176 due to illumination which over-fills the gap region 178.

While preferred embodiments of the invention have been described in detail along with various alternative configurations, it must be kept in mind that other modifications may also be made according to the teachings of this invention. For example, there are numerous waveguide geometries beyond the more common types mentioned, all of which may have potential application in this invention. Also, the interaction of a moving plasma in a semiconductor with impinging electromagnetic radiation will affect signals whose frequencies extend beyond what is commonly considered the microwave region. Therefore, the disclosure of the preferred embodiments of the present invention is intended to be illustrative, but not limiting, of the scope of the invention which is set forth in the following claims.

I claim:

1. A device for modifying electromagnetic signals, comprising:
   (a) a semiconductor with means for introducing an electromagnetic signal into the semiconductor; and
   (b) means for applying energy to a location on the semiconductor, which energy creates a plasma front which interacts with the electromagnetic signals as they impinge on an energized portion of the semiconductor, and moving the location of energy application and resulting plasma front toward a non-energized portion of the semiconductor.

2. The device of claim 1 wherein the means for moving the location of energy application moves the resulting plasma front at a speed within two orders of magnitude of the electromagnetic propagation speed within the semiconductor.

3. The device of claim 1 wherein the means for applying energy to a location on the semiconductor moves the location of energy application and resulting plasma front in a direction between 90 degrees and 270 degrees different from the direction of the electromagnetic signals.

4. The device of claim 1 wherein the means for applying energy to a location on the semiconductor moves the location of energy application and resulting plasma front in a direction within 90 degrees of the direction of the electromagnetic signals.

5. The device of claim 1 wherein the means for applying energy to a location on the semiconductor comprises a pulse of laser light having numerous ray paths to the semiconductor which ray paths are directed such that the pulse sweeps toward the non-energized portion.

6. The device of claim 5 wherein the ray paths are directed by a prism.

7. The device of claim 1 wherein the means for applying energy to a location on the semiconductor comprises a beam of laser light directed through an electro-optical beam deflector.

8. The device of claim 1 wherein the means for applying energy to a location on the semiconductor comprises a beam of laser light directed by means of phased array optical beam steering.

9. The device of claim 1 wherein the means for applying energy to a location on the semiconductor comprises a pulse of laser light passing through the semiconductor beginning at the energized portion and continuing on toward the non-energized portion.

10. The device of claim 1 wherein the means for applying energy to a location on the semiconductor comprises an electron beam with directional beam deflector.

11. The device of claim 1 further comprising a waveguide for which the semiconductor is a dielectric through which guided wave energy passes.

12. The device of claim 11 further comprising an electromagnetic signal generator coupled to the waveguide.

13. The device of claim 12 further comprising a directional coupler coupled between the signal generator and the waveguide.

14. The device of claim 12 further comprising an optical switch coupled between the signal generator and the waveguide.

15. The device of claim 12 further comprising a stationary laser beam directed upon a portion of the semiconductor remote from the signal generator, which laser beam generates a plasma in the semiconductor which interacts with the electromagnetic signals.

16. The device of claim 12 wherein the waveguide has an end remote from the signal generator and further comprising:
   (a) a second waveguide electrically coupled to the semiconductor near the end of the waveguide and defining a gap between the first and the second waveguide, and
   (b) a stationary laser beam directed upon the gap, which laser beam generates a plasma in the semiconductor electrically coupling the waveguides.

17. The device of claim 12 further comprising a second waveguide high frequency coupled, by means of a capacitive gap, to an end of the first waveguide remote from the signal generator.

18. The device of claim 12 wherein the waveguide is a cavity resonator.

19. The device of claim 11 wherein the waveguide comprises two conductors.

20. The device of claim 19 wherein a voltage is applied across the two conductors.

21. A device for generating fast electrical signals, comprising:
   (a) a pair of conductors coupled to a semiconductor material, with contract surfaces between each of the conductors and the semiconductor material, one of which contact surfaces is generally linear such that the portion of the semiconductor material substantially between the conductors defines a volume which has a length parallel to the generally linear contact surface, which length is greater than a width separating the contact surface; and
   (b) means for applying energy to a location on the volume's length, which energy creates a plasma front and electromagnetic signals, and moving the location of energy application and resulting plasma front toward a non-energized portion of the volume's length.

22. The device of claim 21 wherein the means for moving the location of energy application moves the resulting plasma front at a speed within two orders of magnitude of the electromagnetic propagation speed within the conductors.

23. The device of claim 21 further comprising means for applying a voltage across the pair of conductors.

* * * * *